(12) United States Patent
Mittal et al.

(10) Patent No.: US 10,447,280 B2
(45) Date of Patent: Oct. 15, 2019

(54) DELAY-LOCKED LOOP (DLL) WITH DIFFERENTIAL DELAY LINES

(71) Applicant: Qualcomm Incorporated, San Diego, CA (US)

(72) Inventors: Ayush Mittal, Bangalore (IN); Gajanan Maroti Devpuje, Munnekolala (IN); Bhushan Shanti Asuri, San Diego, CA (US); Krishnaswamy Thiagarajan, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 96 days.

(21) Appl. No.: 15/711,708

(22) Filed: Sep. 21, 2017

(65) Prior Publication Data

US 2019/0089358 A1  Mar. 21, 2019

(51) Int. Cl.
| | |
|---|---|
| *H03L 7/06* | (2006.01) |
| *H03L 7/07* | (2006.01) |
| *H03L 7/081* | (2006.01) |
| *H03K 5/133* | (2014.01) |
| *H03L 7/099* | (2006.01) |
| *H03L 7/089* | (2006.01) |
| *H03L 7/093* | (2006.01) |

(52) U.S. Cl.
CPC ............. *H03L 7/07* (2013.01); *H03K 5/133* (2013.01); *H03L 7/0812* (2013.01); *H03L 7/0814* (2013.01); *H03L 7/0891* (2013.01); *H03L 7/093* (2013.01); *H03L 7/0995* (2013.01)

(58) Field of Classification Search
CPC ....................................................... H03L 7/07
USPC .......................................................... 327/158
See application file for complete search history.

(56) References Cited

U.S. PATENT DOCUMENTS

| | | |
|---|---|---|
| 6,100,735 A | 8/2000 | Lu |
| 7,199,625 B1 | 4/2007 | Chung |
| (Continued) | | |

FOREIGN PATENT DOCUMENTS

WO    2012100226 A1    7/2012

OTHER PUBLICATIONS

International Search Report and Written Opinion—PCT/US2018/048336—ISA/EPO—dated Nov. 26, 2018
(Continued)

*Primary Examiner* — Metasebia T Retebo
(74) *Attorney, Agent, or Firm* — Colby Nipper/Qualcomm

(57) ABSTRACT

An integrated circuit is disclosed that implements a delay-locked loop with differential delay lines. In an example aspect, the integrated circuit includes a first delay line, a second delay line, and control circuitry. The first and second delay lines are coupled to a reference clock source to receive a reference clock. The first delay line produces a first delayed signal that is delayed relative to the reference clock by a first delay amount. The second delay line produces a second delayed signal that is delayed relative to the reference clock by a second delay amount. The control circuitry is coupled to the first and second delay lines. The control circuitry is configured to receive the first delayed signal, to receive the second delayed signal, and to adjust the first delay amount or the second delay amount based on the first delayed signal and the second delayed signal.

25 Claims, 10 Drawing Sheets

(56) References Cited

U.S. PATENT DOCUMENTS

| | | |
|---|---|---|
| 7,733,147 B2 | 6/2010 | Lee et al. |
| 8,854,098 B2 * | 10/2014 | Yang .................... H03L 7/0812 |
| | | 327/233 |
| 2002/0039052 A1 | 4/2002 | Straub et al. |
| 2006/0220749 A1 | 10/2006 | Rosik et al. |
| 2008/0116949 A1 | 5/2008 | Nair |
| 2009/0256605 A1 * | 10/2009 | Yoshizawa ............ H03L 7/0805 |
| | | 327/158 |

OTHER PUBLICATIONS

Sidiropoulos S., et al., "A Semidigital Dual Delay-Locked Loop", IEEE Journal of Solid-State Circuits, vol. 32, No. 11, Nov. 1997, pp. 1683-1692.

\* cited by examiner

DELAY-LOCKED LOOP (DLL) WITH DIFFERENTIAL DELAY LINES

TECHNICAL FIELD

This disclosure relates generally to electronic communications and, more specifically, to enabling a signal to be delayed to achieve a desired relative timing using differential delay lines in a delay-locked loop (DLL).

BACKGROUND

Electronic devices include traditional computing devices such as desktop computers, notebook computers, smart phones, wearable devices like a smart watch, servers, and the like. However, electronic devices also include other types of computing devices such as personal voice assistants, thermostats, automotive electronics, robotics, devices embedded in other machines like refrigerators and industrial tools, Internet-of-Things (IoTs) devices, and so forth. These various electronic devices provide information, entertainment, social interaction, security, safety, productivity, transportation, and other services to human users. Thus, electronic devices play crucial roles in many aspects of modern society.

Many of the services provided by electronic devices in today's interconnected world depend at least partly on electronic communications. Electronic communications can include those between and among widely distributed electronic devices using wireless or wired signals over one or more networks, such as the Internet or a cellular network. Electronic communications can also include those between different printed circuit boards, modules, chips, or cores of an integrated circuit within a single electronic device. Regardless, electronic communications are usually accomplished by generating or propagating signals. Typically, such electronic communications are performed more quickly or more reliably by controlling the relative timing of a signal in relation to one or more other signals.

A timing of a signal in relation to another signal is referred to as a phase difference between the two signals, or relative phases between the two signals. To use a signal for electronic communications, the phase of the signal is adjusted in many circumstances. The phase of a signal can be adjusted by, for example, delaying the signal. A delay-locked loop (DLL) is a digital circuit that can delay a signal to introduce a phase shift or phase delay into the signal to produce a delayed signal. The delayed signal can be used to facilitate a timing alignment with another signal, to generate a radio frequency (RF) transmission signal, and so forth.

In an example usage scenario, a delay-locked loop can be used to shift a phase of a signal, such as a clock signal. The phase-shifted clock signal can enhance a clock rise timing with respect to a valid output timing of a data signal having data that is to be obtained via a sampling of the data signal. The delay-locked loop shifts the clock signal for the data sampling such that a rising edge of the clock signal is likely to occur near the middle of a time period during which a data value of the data signal is expected to be valid. This increases the likelihood of successfully acquiring the valid data.

In another example usage scenario, a delay-locked loop can shift a phase of a clock signal by some number of degrees, such as 45 degrees, to facilitate transmission of signals at radio frequencies. A harmonic rejection mixer (HRM) is employed in some RF transceivers, such as at an RF transmitter thereof, to reduce the occurrence of spurious harmonic frequencies that can lower a quality of a transmission signal. An HRM typically uses at least four different phases of a clock signal (e.g., 0°, 45°, 90°, and 135° shifted versions of the clock signal) to filter out, or at least reduce, the undesired harmonic frequencies. A delay-locked loop can be used to generate any of the four different phases of the clock signal for an HRM.

Thus, delay-locked loops are employed in multiple different usage scenarios to support electronic communications with electronic devices. Consequently, electrical engineers and other designers of electronic devices strive to improve the functionality and usability of delay-locked loops to facilitate electronic communications with electronic devices.

SUMMARY

Delay-locked loops (DLLs) with differential delay lines are disclosed herein. The disclosed delay-locked loops can be used to align clock signals to enhance data acquisition timing, can be used with mixers to generate phase-shifted clock signals to reject spurious harmonic frequencies, and so forth.

In an example aspect, a delay-locked loop is disclosed. The delay-locked loop includes a first delay line, a second delay line, and control circuitry. The first delay line includes a first input and a first output, with the first input coupled to a reference clock source. The first delay line is configured to produce a first delayed signal. The second delay line includes a second input and a second output, with the second input coupled to the reference clock source. The second delay line is configured to produce a second delayed signal. The control circuitry includes a phase detector and a differential amplifier. The phase detector includes a first input, a second input, and an output. The first input of the phase detector is coupled to the first output of the first delay line, and the second input of the phase detector is coupled to the second output of the second delay line. The phase detector is configured to receive the first delayed signal via the first input of the phase detector and to receive the second delayed signal via the second input of the phase detector. The differential amplifier includes an input, a plus output, and a minus output. The input of the differential amplifier is coupled to the output of the phase detector, the plus output is coupled to the first delay line, and the minus output is coupled to the second delay line.

In an example aspect, an integrated circuit is disclosed. The integrated circuit includes a first delay line coupled to a reference clock source, a second delay line coupled to the reference clock source, and control circuitry coupled to the first delay line and the second delay line. The first delay line is configured to receive a reference clock from the reference clock source and to produce a first delayed signal that is delayed relative to the reference clock by a first delay amount. The second delay line is configured to receive the reference clock from the reference clock source and to produce a second delayed signal that is delayed relative to the reference clock by a second delay amount. The control circuitry is configured to receive the first delayed signal and to receive the second delayed signal. The control circuitry is also configured to adjust the first delay amount or the second delay amount based on the first delayed signal and the second delayed signal.

In an example aspect, an integrated circuit is disclosed. The integrated circuit includes a reference clock source configured to provide a reference clock. The integrated circuit also includes a first delay line coupled to the reference clock source and a second delay line coupled to the reference clock source. The first delay line is configured to produce a first delayed signal that is delayed relative to the reference clock by a first delay amount. The second delay line is configured to produce a second delayed signal that is delayed relative to the reference clock by a second delay amount. The integrated circuit further includes control means for adjusting the first delay amount or the second delay amount based on the first delayed signal and the second delayed signal.

In an example aspect, a method for operating a delay-locked loop with differential delay lines is disclosed. The method includes delaying propagation of a reference clock by a first delay amount to produce a first delayed signal and delaying propagation of the reference clock by a second delay amount to produce a second delayed signal. The method also includes determining a phase indication that is indicative of a phase difference between the first delayed signal and the second delayed signal. The method additionally includes generating a first delay control signal and a second delay control signal based on the phase indication. The method further includes adjusting the first delay amount responsive to the first delay control signal and adjusting the second delay amount responsive to the second delay control signal.

DETAILED DESCRIPTION

Figure 1:
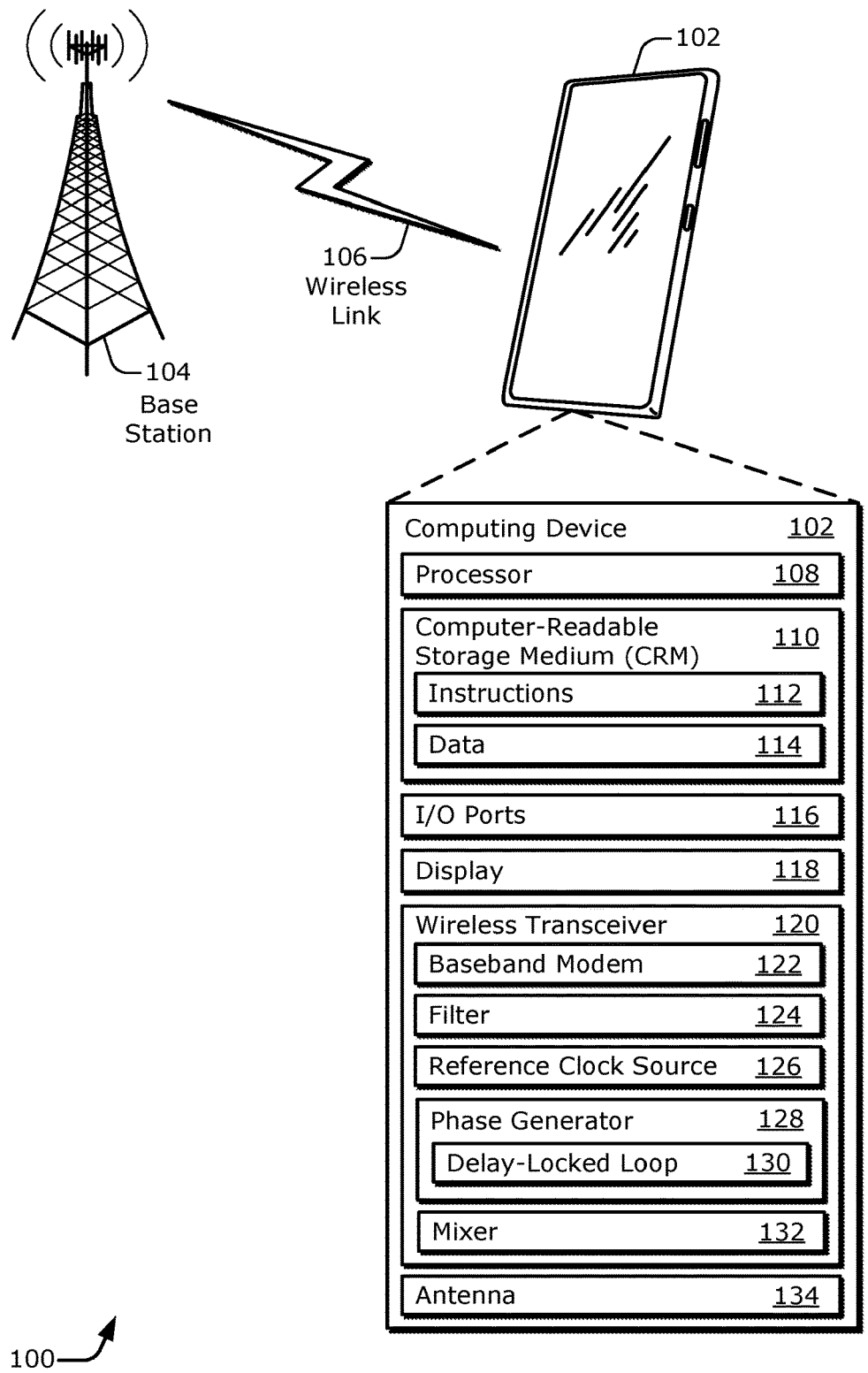
FIG. 1 illustrates an example environment that includes a wireless transceiver in which a delay-locked loop (DLL) with differential delay lines can be implemented.

Existing delay-locked loops include a single adjustable delay line that generates a delayed clock signal from a reference clock signal in accordance with a variable delay amount. A feedback loop compares the reference clock signal to the delayed clock signal to detect a phase difference between the two clock signals. The detected phase difference is coupled to an amplifier that compares the detected phase difference to a desired phase difference. An output of the amplifier is used to set the variable delay amount for the single adjustable delay line. The amplifier output changes the variable delay amount until the desired phase difference between the reference clock signal and the delayed clock signal is established by a currently-in-effect delay amount. At this time, the delay-locked loop is locked to this delay amount to create a desired phase difference between the two clock signals. However, existing delay-locked loops cannot be tuned across a wide frequency range (e.g., a frequency range having a 1:2 or greater ratio) using the single adjustable delay line while still attaining low phase noise and a low current consumption. And modern wireless standards have wide frequency tuning bands that can reach a 1:2 or higher frequency ratio, as is explained below.

To implement a delay-locked loop—e.g., in conjunction with a harmonic rejection mixer (HRM), the delay-locked loop is responsible for shifting a phase of a signal having a range of frequencies. This range of frequencies extends across a tuning range of the corresponding radio frequency (RF) transmitter. To accommodate modern wireless standards, such as those for cellular network systems, some RF transmitters are responsible for implementing a wideband frequency tuning range (e.g., a frequency range of 1.4 GHz-2.7 GHz).

Different tuning frequencies are associated with different delay amounts in a delay-locked loop with a duration of each different delay amount being inversely proportional to the frequency. Thus, if a frequency at a high end of a frequency band is double a frequency at a low end of the band, the two associated delay amounts are likewise doubled in duration. Consequently, typical existing delay-locked loops cannot be tuned to operate reliably across a frequency range of e.g. 1.4 GHz-2.7 GHz, which has a 1:2 frequency range ratio, while still achieving low phase noise and a low current consumption. Instead, designers of RF transceiver systems have resorted to using two or more different delay-locked loops to cover tuning ranges having a 1:2 frequency range ratio.

In contrast with previous approaches, some example implementations utilize two adjustable delay lines in a delay-locked loop. A first delay line realizes a first propagation path to produce a first delayed signal. A second delay line realizes a second propagation path to produce a second delayed signal. With two delay lines, a reference clock can be delayed by two different delay amounts. If the two delay amounts are being adjusted to establish a desired phase difference between the first and second delayed signals, the delay amounts can be changed in opposite directions (e.g., by increasing one delay amount while decreasing the other delay amount). Accordingly, the total delay amount differential between the first and second delayed signals, which corresponds to a relative phase shift between the two signals, can be doubled, which enables a tuning across a wider frequency band.

In other example implementations, an integrated circuit includes a first delay line, a second delay line, and control circuitry. The first delay line is coupled to a reference clock source to receive a reference clock. The first delay line produces a first delayed signal that is delayed relative to the reference clock by a first delay amount. The second delay line is coupled to the reference clock source to receive the reference clock. The second delay line produces a second delayed signal that is delayed relative to the reference clock by a second delay amount. The control circuitry is coupled to the first delay line to receive the first delayed signal and to the second delay line to receive the second delayed signal. The control circuitry adjusts the first delay amount and the second delay amount based on a phase difference between the first delayed signal and the second delayed signal. The control circuitry can, for example, adjust the first and second delay amounts until the first and second delayed signals are separated by a desired phase difference.

In some implementations, the control circuitry can increase the first delay amount while decreasing the second delay amount such that both the first delay line and the second delay line are participating in a relative phase shifting of the first and second delayed signals. In these manners, a delay-locked loop can extend across a wide tuning band range (e.g., one with a 1:2 frequency ratio) using differential delay lines instead of two separate delay-locked loops.

FIG. 1 illustrates an example environment 100 that includes a wireless transceiver 120 in which a delay-locked loop 130 (DLL) with differential delay lines can be implemented. The example environment 100 includes a computing device 102 that communicates with a base station 104 through a wireless communication link 106 (wireless link 106). In this example, the computing device 102 is implemented as a smart phone. However, the computing device 102 may be implemented as any suitable computing or electronic device, such as a modem, cellular base station, broadband router, access point, cellular phone, gaming device, navigation device, media device, laptop computer, desktop computer, tablet computer, server, network-attached storage (NAS) device, smart appliance, vehicle-based communication system, Internet-of-Things (IoTs) device, and so forth.

The base station 104 communicates with the computing device 102 via the wireless link 106, which may be implemented as any suitable type of wireless link. Although depicted as a base station tower of a cellular radio network, the base station 104 may represent or be implemented as another device, such as a satellite, cable television head-end, terrestrial television broadcast tower, access point, peer-to-peer device, mesh network node, fiber optic line, and so forth. Hence, the computing device 102 may communicate with the base station 104 or another device via a wired connection, a wireless connection, or a combination thereof.

The wireless link 106 can include a downlink of data or control information communicated from the base station 104 to the computing device 102 and an uplink of other data or control information communicated from the computing device 102 to the base station 104. The wireless link 106 may be implemented using any suitable communication protocol or standard, such as 3rd Generation Partnership Project Long-Term Evolution (3GPP LTE), IEEE 802.11, IEEE 802.16, Bluetooth™, and so forth.

The computing device 102 includes a processor 108 and a computer-readable storage medium 110 (CRM 110). The processor 108 may include any type of processor, such as an application processor or multi-core processor, that is configured to execute processor-executable code stored by the CRM 110. The CRM 110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the computing device 102, and thus does not include transitory propagating signals or carrier waves.

The computing device 102 may also include input/output ports 116 (I/O ports 116) or a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, and so forth. The display 118 presents graphics of the computing device 102, such as a user interface associated with an operating system, program, or application. Alternatively or additionally, the display 118 may be implemented as a display port or virtual interface through which graphical content of the computing device 102 is communicated or presented.

For communication purposes, the computing device 102 also includes a wireless transceiver 120 and an antenna 134. The wireless transceiver 120 provides connectivity to respective networks and other electronic devices connected therewith. Alternatively or additionally, the computing device 102 may include a wired transceiver, such as an Ethernet or fiber optic interface for communicating over a personal or local network, an intranet, or the Internet. The wireless transceiver 120 may facilitate communication over any suitable type of wireless network, such as a wireless local area network (LAN) (WLAN), a peer-to-peer (P2P) network, a mesh network, a cellular network, a wireless wide-area-network (WWAN), and/or a wireless personal-area-network (WPAN). In the context of the example environment 100, the wireless transceiver 120 enables the computing device 102 to communicate with the base station 104 and networks connected therewith.

The wireless transceiver 120 includes circuitry and logic for transmitting or receiving a communication signal for at least one communication frequency band. In operation, the wireless transceiver 120 can implement at least one, e.g., radio frequency (RF) transceiver to process data and/or signals associated with communicating data of the computing device 102 via the antenna 134. The wireless transceiver 120 includes at least one baseband modem 122. The baseband modem 122 may be implemented as a system on-chip (SoC) that provides a digital communication interface for data, voice, messaging, and other applications of the computing device 102. The baseband modem 122 may also include baseband circuitry to perform high-rate sampling processes that can include analog-to-digital conversion (ADC), digital-to-analog conversion (DAC), gain correction, skew correction, frequency translation, and so forth.

Generally, the wireless transceiver 120 can include band-pass filters, switches, amplifiers, and so forth for routing and conditioning signals that are transmitted or received via the antenna 134. As shown, the wireless transceiver 120 also includes at least one filter 124, at least one reference clock source 126, at least one phase generator 128, and at least one mixer 132. Here, the phase generator 128 includes at least one delay-locked loop 130 (DLL 130). Thus, the wireless transceiver 120 can provide some attenuation for wireless signals at different frequencies using the filter 124. The wireless transceiver 120 can further perform frequency conversion using the mixer 132, which may include an upconverter and/or a downconverter that performs frequency conversion in a single conversion step, or through multiple conversion steps. The wireless transceiver 120 may also include logic to perform in-phase/quadrature (I/Q) operations, such as synthesis, encoding, modulation, decoding, demodulation, and so forth.

In some cases, components of the wireless transceiver 120 are implemented as separate receiver and transmitter entities. Additionally or alternatively, the wireless transceiver 120 can be realized using multiple or different sections to implement respective receiving and transmitting operations (e.g., using separate transmit and receive chains). Operations of, as well as interactions between, the filter 124, the reference clock source 126, the phase generator 128—including the delay-locked loop 130, and the mixer 132 are described with reference to FIG. 2. The delay-locked loop 130 can at least partially implement a delay-locked loop with differential delay lines.

Figure 2:
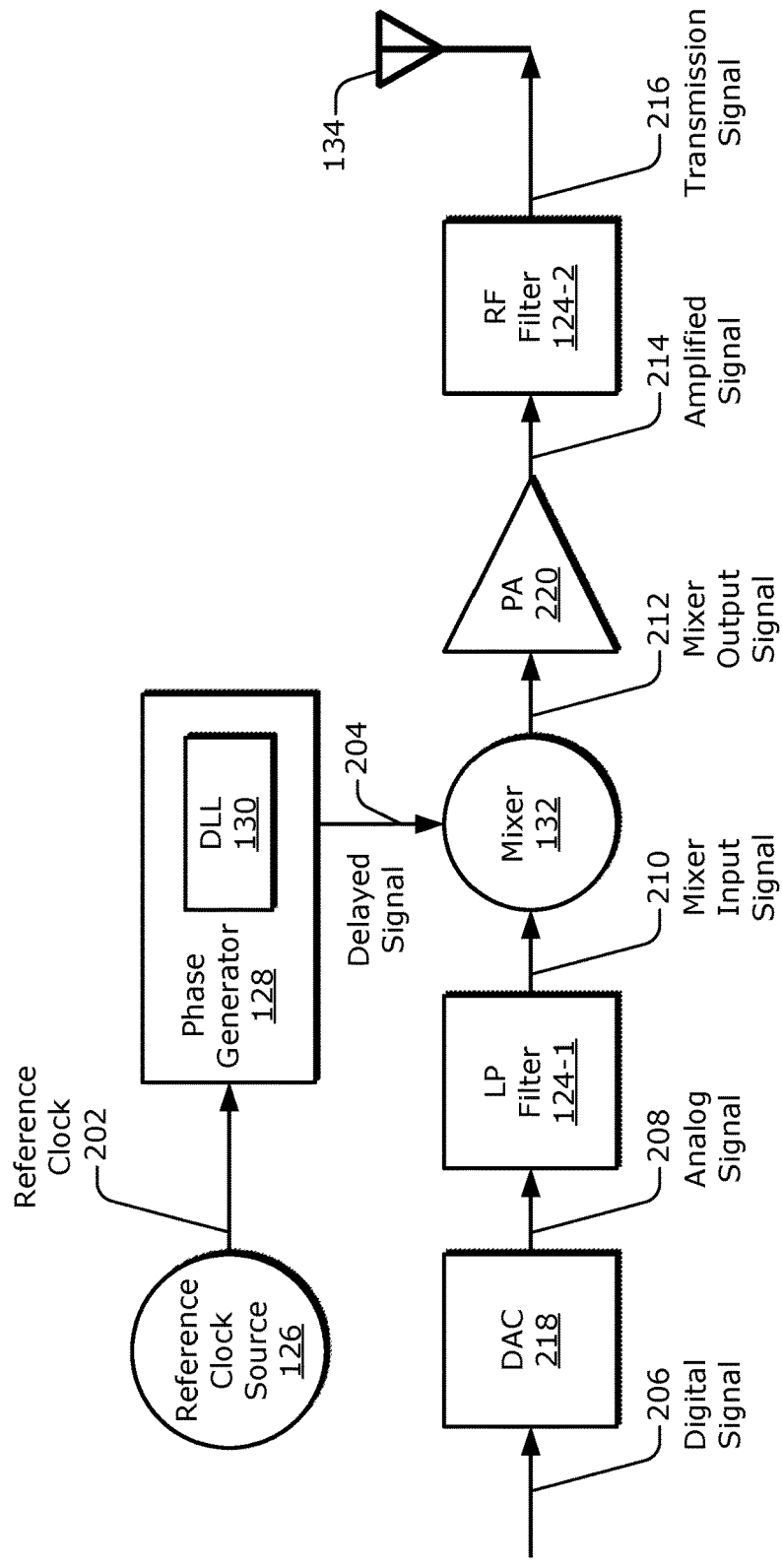
FIG. 2 illustrates an example wireless transceiver that includes a phase generator in which a delay-locked loop with differential delay lines can be implemented to operate in conjunction with a mixer.

FIG. 2 illustrates an example of the wireless transceiver 120 that includes the phase generator 128 in which a delay-locked loop with differential delay lines—e.g., the delay-locked loop 130—can be implemented to operate in conjunction with the mixer 132. The example components of the wireless transceiver 120 are depicted in two rows: an upper row and a lower row. The upper row includes the reference clock source 126 and the phase generator 128. From left-to-right, the lower row includes a digital-to-analog converter 218 (DAC 218), a low-pass filter 124-1, the mixer 132, a power amplifier 220 (PA 220), an RF filter 124-2, and the antenna 134.

In example implementations, for the upper row, the reference clock source 126 produces a reference clock 202. The reference clock 202 can oscillate at one or more frequencies to provide an oscillating clock signal or an oscillation signal. The reference clock source 126 can include an oscillator that generates a reference clock 202, can strengthen or condition a reference clock 202 received from another component, can change a frequency of a received reference clock 202, can selectively gate or release an incoming reference clock 202, some combination thereof, and so forth. The reference clock source 126 is coupled to the phase generator 128 and provides the reference clock 202 to the phase generator 128.

Thus, the phase generator 128 is coupled to the reference clock source 126 to receive the reference clock 202. The phase generator 128 generates one or more signals having different phases based on the reference clock 202. To do so, the delay-locked loop 130 delays the reference clock 202 to produce at least one delayed signal 204. For example, one delay-locked loop 130 can delay a 0-degree phase signal to produce a 45-degree phase signal, and another delay-locked loop 130 can delay a 90-degree phase signal to produce a 135-degree phase signal, even over a wide (e.g., 2:1) frequency band. Thus, at least one phase-shifted signal is provided from the phase generator 128 to the mixer 132 as the delayed signal 204.

In some implementations, the mixer 132 is realized as a harmonic rejection mixer (HRM). With an HRM, four phases of a clock signal are used: a 0-degree phase clock signal, a 45-degree phase clock signal, a 90-degree phase clock signal, and a 135-degree phase clock signal. The phase generator 128 can provide these phase-shifted clock signals to the mixer 132 for use in mixing a lower-frequency input signal that is to be upconverted for subsequent transmission. This input signal and the mixing thereof is described for the lower row.

In the lower row, the digital-to-analog converter 218 receives a digital signal 206, such as from the baseband modem 122 of FIG. 1. The digital-to-analog converter 218 performs a digital-to-analog conversion and produces an analog signal 208. The digital-to-analog converter 218 is coupled to the low-pass filter 124-1 and provides the analog signal 208 to the low-pass filter 124-1. The low-pass filter 124-1 performs a low-pass filtering operation by attenuating higher frequencies to produce a mixer input signal 210. The low-pass filter 124-1 is coupled to the mixer 132 and provides the mixer input signal 210 to the mixer 132.

The mixer 132 therefore receives the mixer input signal 210 from the low-pass filter 124-1. The mixer 132 performs an upconverting operation to facilitate an RF transmission from the wireless transceiver 120. To do so, the mixer 132 mixes the mixer input signal 210 with at least one higher-frequency signal, such as the delayed signal 204. As part of this mixing up-conversion operation, for an HRM implementation, the mixer 132 rejects certain harmonics of the mixer input signal 210 using the delayed signal 204. As a result of the up-conversion operation, the mixer 132 produces a mixer output signal 212. The mixer 132 is coupled to the power amplifier 220 and provides the mixer output signal 212 to the power amplifier 220.

The power amplifier 220 amplifies the mixer output signal 212 to produce an amplified signal 214. The power amplifier 220 is coupled to the RF filter 124-2 and provides the amplified signal 214 to the RF filter 124-2. The RF filter 124-2 filters the amplified signal 214 to accommodate the intended communication frequency band to produce a transmission signal 216. The RF filter 124-2 is coupled to the antenna 134 and provides the transmission signal 216 to the antenna 134. The antenna 134 can then emanate the transmission signal 216 from the wireless transceiver 120 as the wireless link 106 of FIG. 1. Although the delay-locked loop 130 is shown in the context of a transmit chain in the wireless transceiver 120, a delay-locked loop 130 with differential delay lines as described herein can be used in a receive chain of a wireless transceiver 120, as well as in alternative environments and scenarios.

Figure 3:
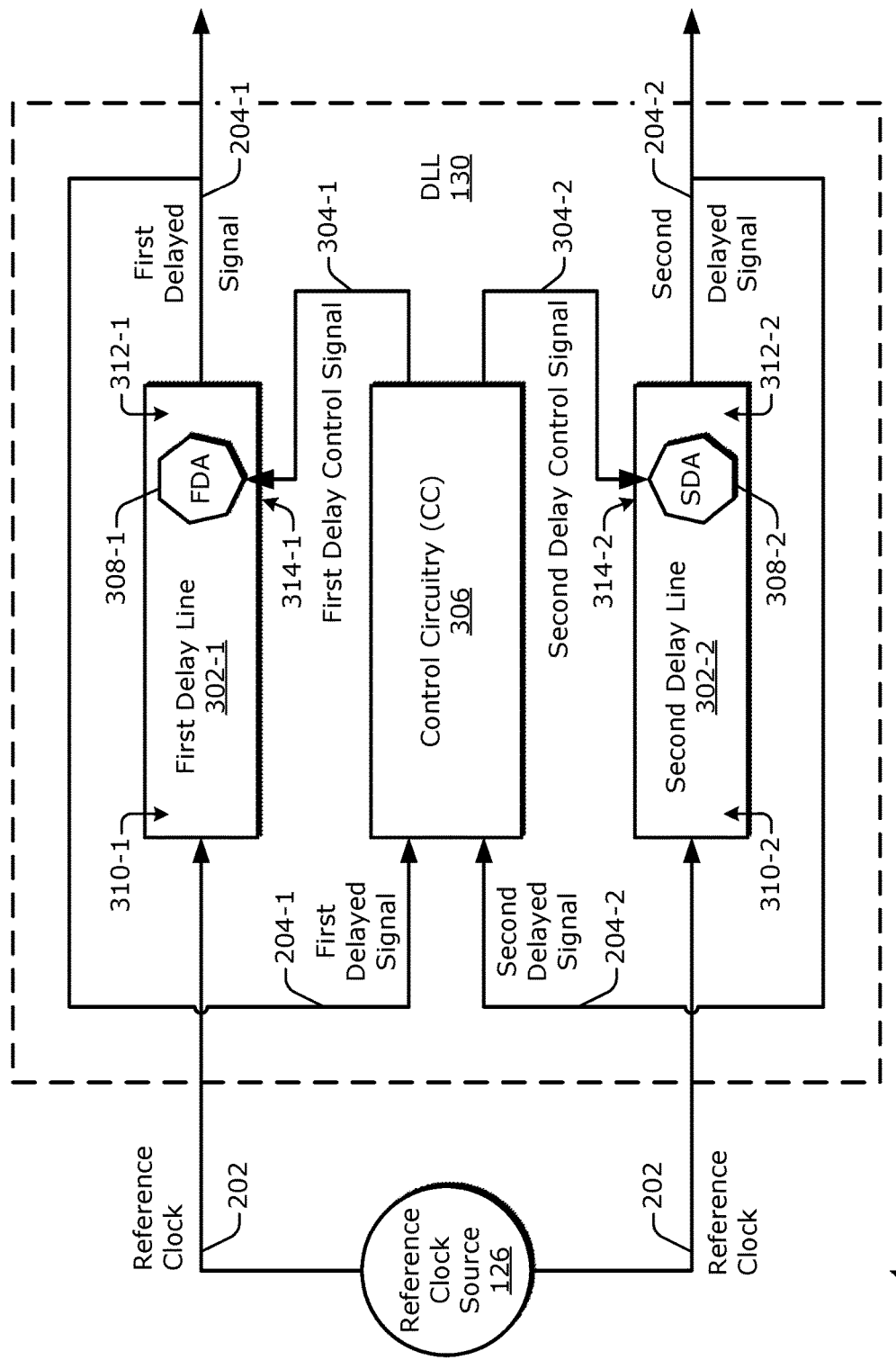
FIG. 3 illustrates an example delay-locked loop that includes differential delay lines and control circuitry.

FIG. 3 illustrates generally at 300 a delay-locked loop 130 (DLL 130) and the reference clock source 126 that provides the reference clock 202. The delay-locked loop 130 includes a first delay line 302-1, a second delay line 302-2, and control circuitry 306. The first delay line 302-1 and the second delay line 302-2 are coupled to the control circuitry 306. The first delay line 302-1 includes a first input 310-1, a first output 312-1, and a first control input 314-1. The second delay line 302-2 includes a second input 310-2, a second output 312-2, and a second control input 314-2. Each input or output in FIG. 3 and the succeeding figures can be realized as, or can correspond to, at least one node, at least one terminal, at least one voltage level, some combination thereof, and so forth.

In example implementations, the first input 310-1 of the first delay line 302-1 and the second input 310-2 of the second delay line 302-2 are both coupled to the reference clock source 126 to receive the reference clock 202. The first delay line 302-1 delays propagation of the reference clock 202 to produce a first delayed signal 204-1 at the first output 312-1 of the first delay line 302-1. The first delay line 302-1 delays the reference clock 202 by a first delay amount 308-1 (FDA 308-1) to produce the first delayed signal 204-1. The second delay line 302-2 delays propagation of the reference clock 202 to produce a second delayed signal 204-2 at the second output 312-2 of the second delay line 302-2. The second delay line 302-2 delays the reference clock 202 by a second delay amount 308-2 (SDA 308-2) to produce the second delayed signal 204-2.

In an example operation, the first delayed signal 204-1 is fed back from the first output 312-1 to the control circuitry 306, and the second delayed signal 204-2 is fed back from the second output 312-2 to the control circuitry 306. The control circuitry 306 produces a first delay control signal 304-1 and a second delay control signal 304-2 based on the first delayed signal 204-1 and the second delayed signal 204-2. The control circuitry 306 can produce the first delay control signal 304-1 and the second delay control signal 304-2 based, for example, on relative phases, or a phase difference, between the first delayed signal 204-1 and the second delayed signal 204-2, which is described with reference to FIG. 4.

The control circuitry 306 provides the first delay control signal 304-1 to the first control input 314-1 of the first delay line 302-1 to adjust the first delay amount 308-1. The control circuitry 306 can thus change a length or duration of the delay amount (e.g., make the delay amount longer or shorter) using the first delay control signal 304-1. Similarly, the control circuitry 306 provides the second delay control signal 304-2 to the second control input 314-2 of the second delay line 302-2 to adjust the second delay amount 308-2. The control circuitry 306 can therefore shorten or lengthen the second delay amount 308-2 that is implemented by the second delay line 302-2 using the second delay control signal 304-2.

Thus, the control circuitry 306 can provide a control mechanism for adjusting the first delay amount 308-1 and the second delay amount 308-2 based on the first delayed signal 204-1 and the second delayed signal 204-2. In some implementations, the control circuitry 306 causes the delay amounts to be adjusted in opposite directions (e.g., the first delay amount 308-1 is lengthened while the second delay amount 308-2 is shortened, or vice versa), as is described below with reference to FIG. 5. Alternatively, one of the two delay amounts can be fixed. For example, the first delay amount 308-1 may be fixed. If so, the control circuitry 306 can adjust the second delay amount 308-2 based on the first delayed signal 204-1 and the second delayed signal 204-2. Even with one fixed-delay-length delay line 302 among two or more differential delay lines, an associated tuning range of the delay-locked loop 130 can be increased.

In this manner, the delay-locked loop 130 can adjust the first delay amount 308-1 or the second delay amount 308-2 to cause the first delayed signal 204-1 to have a desired phase difference relative to the second delayed signal 204-2. For instance, the delay-locked loop 130 can produce the first delayed signal 204-1 and the second delayed signal 204-2 so as to have a 45-degree phase difference between the two signals. Additional example details of the delay lines and the control circuitry are set forth below with reference to FIG. 4.

Figure 4:
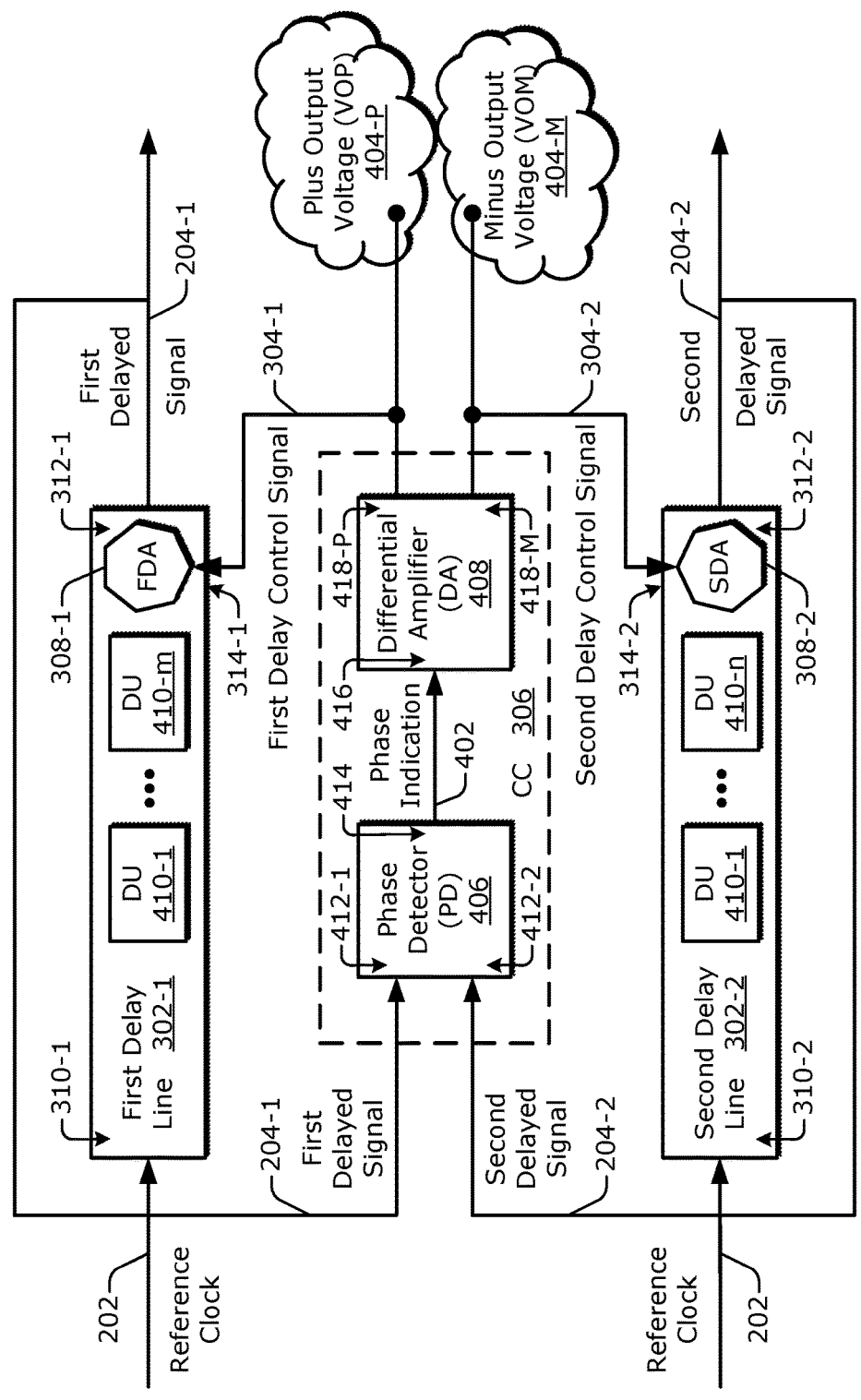
FIG. 4 illustrates another delay-locked loop in which each example delay line includes multiple delay units and example control circuitry includes a phase detector and a differential amplifier.
Figure 6:
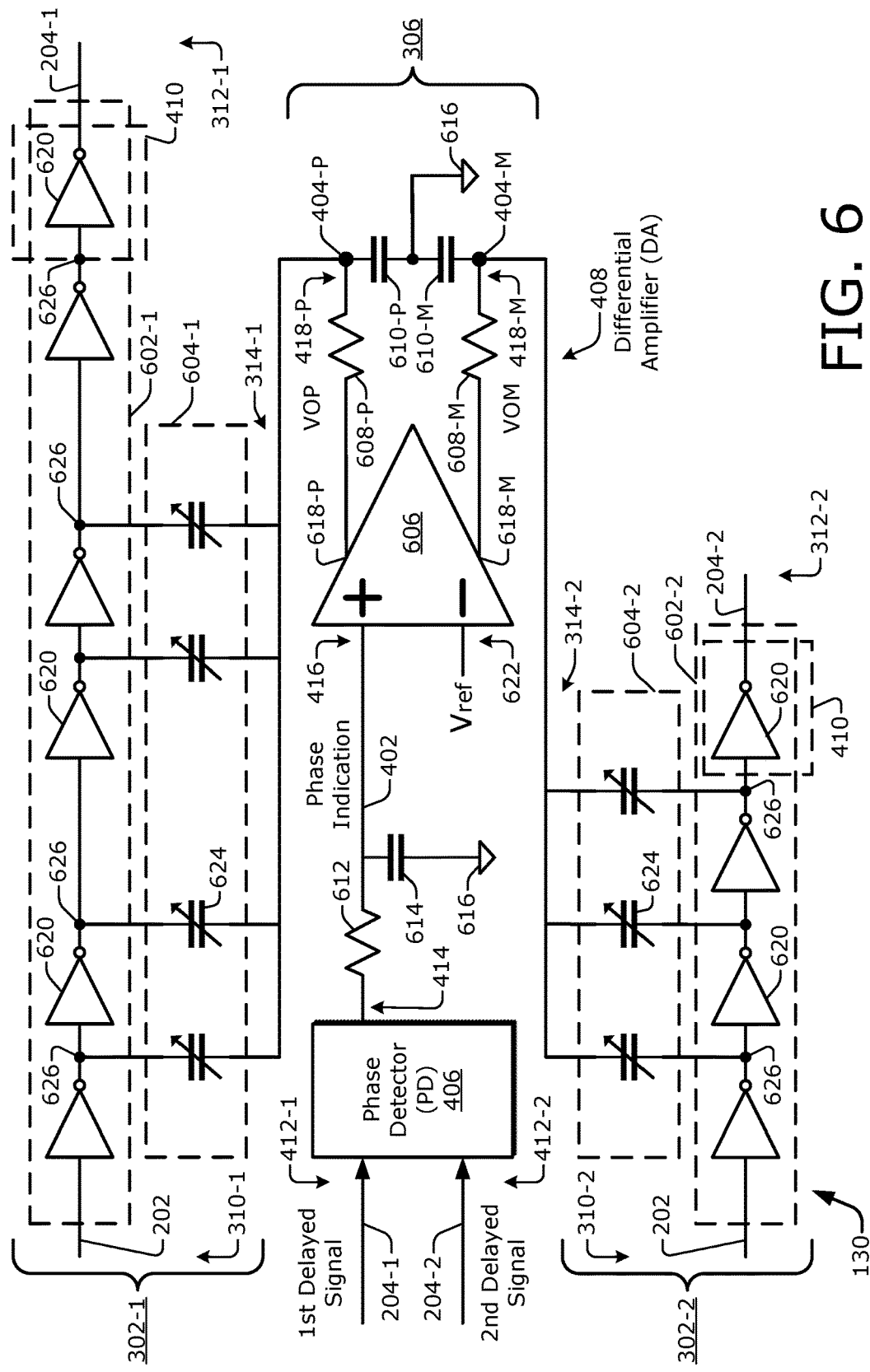
FIG. 6 illustrates another delay-locked loop in which each example delay line includes a propagation path and adjustment circuitry and an example differential amplifier includes a differential operational amplifier.
Figure 8:
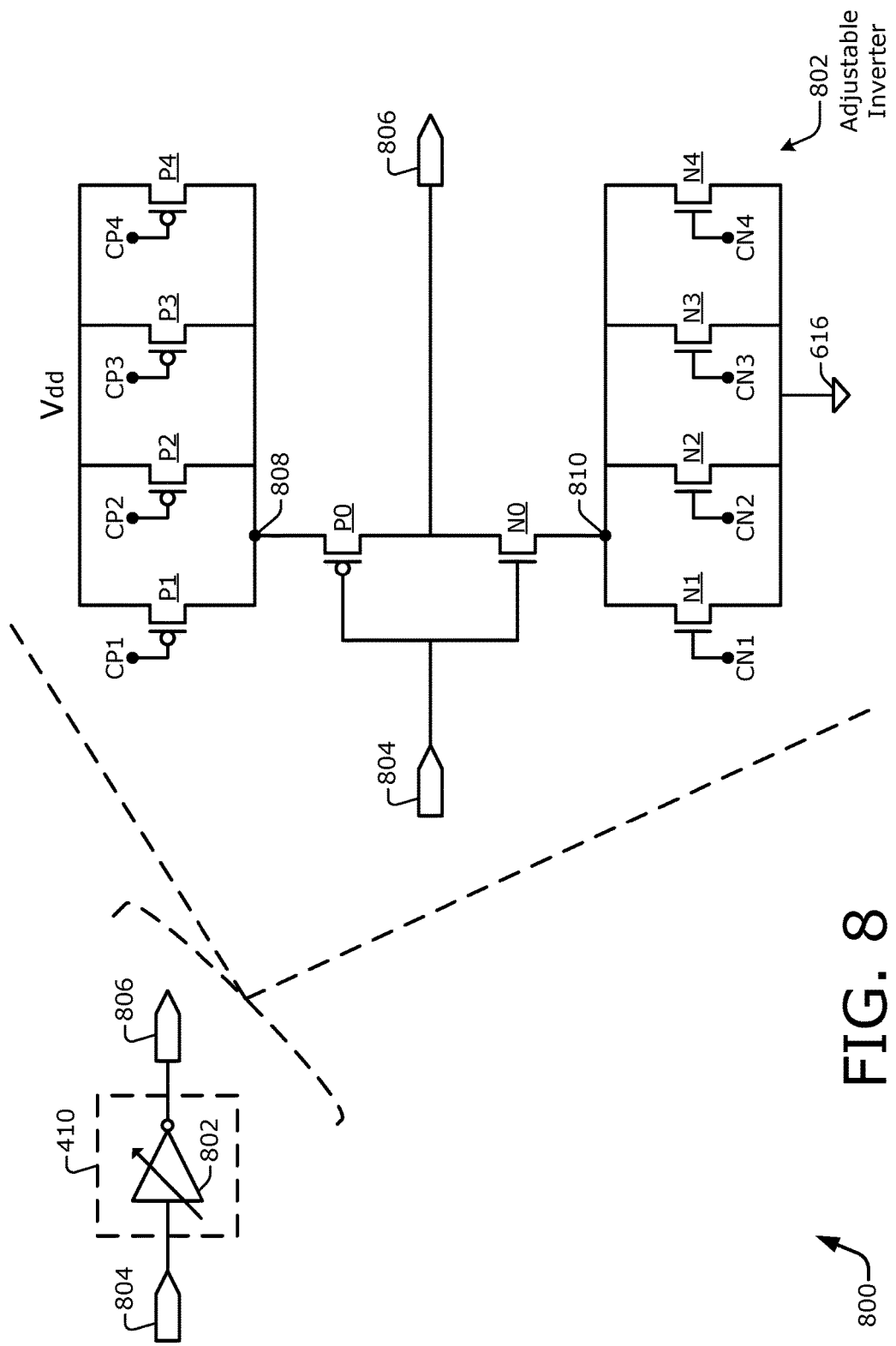
FIG. 8 illustrates an example adjustable delay unit that can be included in a delay line of a delay-locked loop.

FIG. 4 illustrates another example delay-locked loop 130. As shown, the first delay line 302-1 includes multiple delay units 410-1 to 410-$m$ and the second delay line 302-2 includes multiple delay units 410-1 to 410-$n$. The variables "m" and "n" represent positive integers and may be the same or different from each other. The multiple delay units 410-1 to 410-$m$ are coupled together in series along the first delay line 302-1 between the first input 310-1 and the first output 312-2. The multiple delay units 410-1 to 410-$n$ are coupled together in series along the second delay line 302-2 between the second input 310-2 and the second output 312-2. Each delay unit 410 slows propagation of the reference clock 202 at least relative to a propagation speed of the signal along a wire or metal trace that lacks an active circuit device. Example approaches to realizing a delay unit 410 are depicted in FIGS. 6 and 8 and described below.

In example implementations, the control circuitry 306 (CC 306) includes a phase detector 406 and a differential amplifier 408. The phase detector 406 is coupled to the differential amplifier 408. Together, the phase detector 406 and the differential amplifier 408 produce the first delay control signal 304-1 and the second delay control signal 304-2 based on the first delayed signal 204-1 and the second delayed signal 204-2.

The phase detector 406 includes a first input 412-1, a second input 412-2, and an output 414. The first input 412-1 of the phase detector 406 is coupled to the first output 312-1 of the first delay line 302-1. The second input 412-2 of the phase detector 406 is coupled to the second output 312-2 of the second delay line 302-2. Thus, the phase detector 406 receives the first delayed signal 204-1 from the first delay line 302-1 via the first input 412-1 and the second delayed signal 204-2 from the second delay line 302-2 via the second input 412-2. In operation, the phase detector 406 determines a phase indication 402 that is indicative of a phase difference between the first delayed signal 204-1 and the second delayed signal 204-2. The phase detector 406 therefore provides a detection mechanism for determining a phase difference between a first phase of the first delayed signal 204-1 and a second phase of the second delayed signal 204-2.

As shown, the differential amplifier 408 includes at least one input 416, a plus output 418-P, and a minus output 418-M. The input 416 of the differential amplifier 408 is coupled to the output 414 of the phase detector 406. (Another input of the differential amplifier 408 is described below and explicitly depicted in FIG. 6.) The plus output 418-P is coupled to the first delay line 302-1 via the first control input 314-1. The minus output 418-M is coupled to the second delay line 302-2 via the second control input 314-2. Thus, using these couplings, the phase detector 406 provides the phase indication 402 to the differential amplifier 408 via the output 414, and the differential amplifier 408 receives the phase indication 402 from the phase detector 406 via the input 416.

Figure 5:
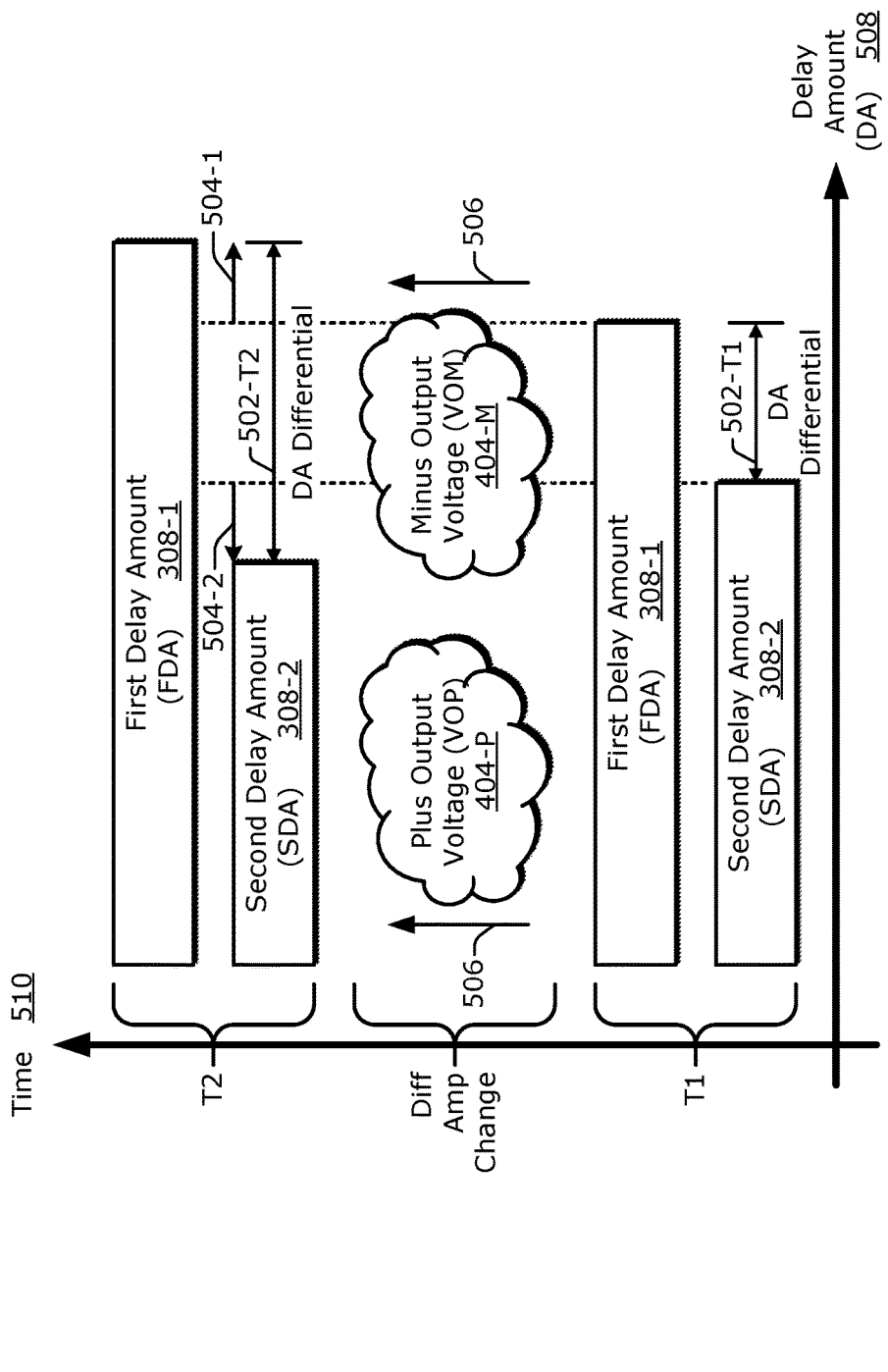
FIG. 5 is a graph illustrating example adjustments to a first delay amount and a second delay amount of a first delay line and a second delay line, respectively.

The differential amplifier 408 generates the first delay control signal 304-1 and the second delay control signal 304-2 based on the phase indication 402. If, for instance, the phase indication 402 reveals that a phase difference between the first delayed signal 204-1 and the second delayed signal 204-2 is insufficient to establish a desired phase difference (e.g., 45 degrees of phase separation), the differential amplifier 408 changes the first delay control signal 304-1 and the second delay control signal 304-2. Based on changed values of the first delay control signal 304-1 and the second delay control signal 304-2, the control circuitry 306 can adjust the first delay amount 308-1 and the second delay amount 308-2. For example, the control circuitry 306 can increase the first delay amount 308-1 and decrease the second delay amount 308-2, or vice versa, as depicted in FIG. 5 and described below. Alternatively, if one delay amount, such as the second delay amount 308-2 is fixed, the second delay control signal 304-2 can be omitted or not routed to the second control input 314-2.

In an example operation, the differential amplifier 408 generates a plus output voltage 404-P (VOP 404-P) on the plus output 418-P and a minus output voltage 404-M (VOM 404-M) on the minus output 418-M. Thus, the differential amplifier 408 changes the plus output voltage 404-P on the plus output 418-P and the minus output voltage 404-M on the minus output 418-M based on the phase indication 402. A change in the plus output voltage 404-P on the plus output 418-P changes a value of the first delay control signal 304-1, which adjusts the first delay amount 308-1. Similarly, a change in the minus output voltage 404-M on the minus output 418-M changes a value of the second delay control signal 304-2, which adjusts the second delay amount 308-2. Thus, the differential amplifier 408 provides an amplification mechanism for generating at least one control signal (e.g., the first delay control signal 304-1 or the second delay control signal 304-2) based on a phase difference between the first delayed signal 204-1 and the second delayed signal 204-2. An example implementation for such an adjustment scheme is described below with reference to FIG. 6.

The differential amplifier 408 can change the first delay control signal 304-1 or the second delay control signal 304-2 until a phase difference represented by the phase indication 402 substantially matches a desired phase difference, which can be represented by a reference voltage (Vref) (e.g., of FIGS. 6 and 7), between the first delayed signal 204-1 and the second delayed signal 204-2. In these manners, the delay-locked loop 130 can adjust a first delay amount 308-1 that is applied to the reference clock 202 by the first delay line 302-1 or a second delay amount 308-2 that is applied to the reference clock 202 by the second delay line 302-2. In some implementations, both the first delay amount 308-1 and the second delay amount 308-2 are adjusted. Using the differential amplifier 408, the plus output voltage 404-P and the minus output voltage 404-M can have opposite voltage values. The first delay control signal 304-1 and the second delay control signal 304-2 can, therefore, likewise move in opposite directions. Accordingly, the first delay amount 308-1 can be increased by some duration while the second delay amount 308-2 is decreased by a similar duration, or vice versa. A net resulting effect is a doubling of the duration adjustment of the relative delay between the first delayed signal 204-1 and the second delayed signal 204-2. This can extend the available tuning range of the delay-locked loop 130 from a frequency perspective.

FIG. 5 depicts a graph 500 that illustrates an example adjustment to the first delay amount 308-1 and the second delay amount 308-2 of the first delay line 302-1 and the second delay line 302-2, respectively. The graph 500 includes an abscissa or x-axis that represents a delay amount 508 and an ordinate or y-axis that represents time 510. The time axis includes a first time (T1), a time at which the differential amplifier changes outputs (Diff Amp Change), and a second time (T2). At the first time (T1), the first delay amount 308-1 and the second delay amount 308-2 jointly result in a first delay amount differential 502-T1.

The phase detector 406 (of FIG. 4) reflects this first delay amount differential 502-T1 as the phase indication 402. The differential amplifier 408 responds to the phase indication 402 by changing the plus output voltage 404-P and the minus output voltage 404-M. As indicated by the vertical arrows 506 at the differential amplifier change time (Diff Amp Change), the absolute values of both the plus output voltage 404-P and the minus output voltage 404-M increase in the illustrated example. These voltage magnitude increases cause adjustments to the two delay amounts.

At the second time (T2), the increase in the plus output voltage 404-P causes the first delay amount 308-1 to increase by a first delay amount adjustment duration 504-1. The increase in the minus output voltage 404-M causes the second delay amount 308-2 to decrease by a second delay amount adjustment duration 504-2. Together, these two delay amount adjustment durations increase the overall delay amount differential. As shown at the second time (T2), the second delay amount differential 502-T2 is greater, or longer, than the first delay amount differential 502-T1.

Thus, in some implementations, the first delay amount 308-1 and the second delay amount 308-2 change in opposite directions. In other words, the control circuitry 306 (e.g., of FIGS. 3 and 4) can increase one delay amount in one delay line while decreasing another delay amount in another delay line. By adjusting two different delay amounts of two different delay lines in opposite directions, the delay-locked loop 130 can increase the available range of delay amount differential 502. The increased range of the delay amount differential 502 enables the delay-locked loop 130 to shift signal phases over a sufficient number of degrees across a wide frequency band to provide phase-shifted reference clocks for, e.g., a harmonic rejection mixer (HRM). Alternatively, one of the two delay amounts (e.g., the first delay amount 308-1 or the second delay amount 308-2) may be fixed while the other is adjusted at the second time (T2), while still extending the tuning range of the delay-locked loop 130.

To tune from 2.7 GHz to 1.4 GHz, for example, the delay-locked loop 130 is responsible for introducing a delay from ~45 picoseconds (ps) to ~90 ps. This equates to a tuning range of 45:90, which is a 1:2 ratio. To attain this ratio, the delay amount along both delay lines can be adjusted. Consider that the plus output voltage 404-P has a 100 mV change for a propagation path of the first delay line 302-1, which results in a 10 ps change in the first delay amount 308-1. The minus output voltage 404-M also changes by 100 mV, but in the opposite direction, for a propagation path of the second delay line 302-2. This results in a 10 ps delay adjustment in the second delay amount 308-2 of the second delay line 302-2. Thus, the effective change in the overall delay is 20 ps in total. The gain of a delay-locked loop as described herein is therefore double as compared to a conventional approach in which a delay amount is adjusted in only a single delay line path. Generally, the first delay amount adjustment duration 504-1 and the second delay amount adjustment duration 504-2 can have substantially equal magnitudes, even if different directions, by using symmetrical circuit devices that differ from each other due to random process variations, current operational temperatures, and so forth.

FIG. 6 illustrates another delay-locked loop 130 in which each example delay line 302 includes a propagation path 602 and adjustment circuitry 604. More specifically, the first delay line 302-1 includes a first propagation path 602-1 and first adjustment circuitry 604-1, and the second delay line 302-2 includes a second propagation path 602-2 and second adjustment circuitry 604-2. The control circuitry 306 includes the phase detector 406 and the differential amplifier 408. The differential amplifier 408 includes a differential operational amplifier 606, a plus resistor 608-P, a minus resistor 608-M, a plus capacitor 610-P, and a minus capacitor 610-M. The control circuitry 306 also includes a resistor 612 and a capacitor 614. The delay-locked loop 130 further includes at least one equipotential 616, such as ground.

With reference to the control circuitry 306, from left-to-right, the resistor 612 is coupled between the output 414 of the phase detector 406 and the input 416 of the differential amplifier 408. The capacitor 614 is coupled between the input 416 of the differential amplifier 408 and the equipotential 616. Thus, the resistor 612 and the capacitor 614 propagate the phase indication 402 from the phase detector 406 to the differential amplifier 408.

The differential amplifier 408 includes the input 416 and another input 622. In this example, the input 416 corresponds to a plus input (+) of the differential operational amplifier 606. The other input 622 of the differential amplifier 408 corresponds to a minus input (−) of the differential operational amplifier 606. This minus input (−) is coupled to a reference voltage (Vref). The reference voltage (Vref) can, for example, be tied to a voltage level that is substantially equivalent to a voltage difference expected between the first delayed signal 204-1 and the second delayed signal 204-2 when the two delayed signals have a desired phase offset. Alternatively, the reference voltage (Vref) can be coupled to a voltage indicative of a phase difference of two or more other signals, such as two other signals that may also be used in a harmonic rejection mixer (HRM).

The differential operational amplifier 606 has a plus output 618-P and a minus output 618-M. The plus resistor 608-P is coupled between the plus output 618-P of the differential operational amplifier 606 and the plus output 418-P of the differential amplifier 408. The minus resistor 608-M is coupled between the minus output 618-M of the differential operational amplifier 606 and the minus output 418-M of the differential amplifier 408. The plus capacitor 610-P and the minus capacitor 610-M are coupled in series with each other between the plus output 418-P and the minus output 418-M of the differential amplifier 408. A node between the plus capacitor 610-P and the minus capacitor 610-M is coupled to the equipotential 616.

With reference to the first delay line 302-1, the first propagation path 602-1 includes the first input 310-1 and the first output 312-1 of the first delay line 302-1. The first adjustment circuitry 604-1 includes the first control input 314-1 of the first delay line 302-1. The first control input 314-1 is coupled to the plus output 418-P of the differential amplifier 408 such that the plus output voltage 404-P is routed to the first control input 314-1. The first propagation path 602-1 provides a propagation mechanism for propagating the reference clock 202 along the first delay line 302-1. The first adjustment circuitry 604-1 provides an adjustment mechanism for adjusting a speed of the propagation of the reference clock 202 along the first delay line 302-1.

With reference to the second delay line 302-2, the second propagation path 602-2 includes the second input 310-2 and the second output 312-2 of the second delay line 302-2. The second adjustment circuitry 604-2 includes the second control input 314-2 of the second delay line 302-2. The second control input 314-2 is coupled to the minus output 418-M of the differential amplifier 408 such that the minus output voltage 404-M is routed to the second control input 314-2. The second propagation path 602-2 provides a propagation mechanism for propagating the reference clock 202 along the second delay line 302-2. The second adjustment circuitry 604-2 provides an adjustment mechanism for adjusting a speed of the propagation of the reference clock 202 along the second delay line 302-2. If one delay amount, say the second delay amount 308-2 of the second delay line 302-2 is fixed, the second adjustment circuitry 604-2 can be omitted.

With reference again to the first delay line 302-1, the first propagation path 602-1 includes multiple delay units, one of which is explicitly designated by 410 in FIG. 6 for clarity. The multiple delay units are coupled in series between the first input 310-1 and the first output 312-1 of the first delay line 302-1 to define multiple nodes, some of which are identified with reference number 626. As shown, each delay unit 410 is implemented as an inverter 620, two of which are explicitly marked in FIG. 6. However, non-inverting buffers or other circuit devices may be used instead to implement a delay unit 410. In the example of FIG. 6, six inverters 620 are coupled in series between respective pairs of nodes 626 of the multiple nodes 626 that are disposed along the first propagation path 602-1. However, more or fewer than six inverters may alternatively be implemented.

The first adjustment circuitry 604-1 includes at least one adjustable capacitor 624. Although four adjustable capacitors are explicitly depicted, more or fewer may alternatively be included in the first adjustment circuitry 604-1. Each adjustable capacitor 624 can be implemented using, for example, at least one varactor or varicap, at least one capacitor bank with one or more switches to selectively engage one or more capacitors, some combination thereof, and so forth. Each adjustable capacitor 624 is coupled between the first propagation path 602-1 and the first control input 314-1 of the first delay line 302-1. More specifically, each adjustable capacitor 624 is coupled to a node 626 of the multiple nodes 626 located between consecutive delay units 410 of the multiple delay units of the first delay line 302-1. Thus, for a given adjustable capacitor 624 having at least two terminals, a terminal can be coupled to a node 626 between consecutive inverters 620, and another terminal can be coupled to the first control input 314-1, which receives the first delay control signal 304-1 (e.g., of FIGS. 3 and 4) as routed from the control circuitry 306.

With reference again to the second delay line 302-2, the second propagation path 602-2 includes multiple delay units, one of which is explicitly designated by 410 in FIG. 6 for clarity. The multiple delay units are coupled in series between the second input 310-2 and the second output 312-2 of the second delay line 302-2 to define multiple nodes, some of which are identified with reference number 626. As shown, each delay unit 410 is implemented as an inverter 620, two of which are explicitly marked. However, non-inverting buffers or other circuit devices may be used instead to realize each delay unit 410. In the example of FIG. 6, four inverters 620 are coupled in series between respective pairs of nodes 626 of the multiple nodes 626 that are disposed along the second propagation path 602-2. However, more or fewer than four inverters may alternatively be implemented.

The second adjustment circuitry 604-2 includes at least one adjustable capacitor 624, one of which is explicitly referenced for clarity. Although three adjustable capacitors are explicitly depicted in FIG. 6, more or fewer may alternatively be included in the second adjustment circuitry 604-2. Each adjustable capacitor 624 can be implemented using, for example, at least one varactor or varicap, at least one capacitor bank with one or more switches to selectively engage one or more capacitors, some combination thereof, and so forth. Each adjustable capacitor 624 is coupled between the second propagation path 602-2 and the second control input 314-2 of the second delay line 302-2. More specifically, each adjustable capacitor 624 is coupled to a node 626 of the multiple nodes 626 located between consecutive delay units 410 of the multiple delay units of the second delay line 302-2. Thus, for a given adjustable capacitor 624 having at least two terminals, ae terminal can be coupled to a node 626 between consecutive inverters 620, and another terminal can be coupled to the second control input 314-2, which receives the second delay control signal 304-2 (e.g., of FIGS. 3 and 4) as routed from the control circuitry 306.

In an example operation of the delay-locked loop 130 in conjunction with a mixer 132, the delay-locked loop 130 can be tuned in two phases: a coarse tuning phase and a fine tuning phase. For the coarse tuning phase, the delay-locked loop 130 is tuned to the vicinity of the intended communication frequency band for the associated wireless transceiver 120. For example, at least one adjustable delay unit 410 (e.g., that is realized using an adjustable-strength inverter) can be included as part of the first propagation path 602-1. The adjustable delay unit 410 is adjusted such that the resulting first delay amount 308-1 (e.g., of FIGS. 3 and 4) for the first delayed signal 204-1 is close to a delay that is appropriate for a desired phase shift, such as 45 degrees, for the intended communication frequency band. A table or register (not shown), for instance, can hold a value setting a delay length (e.g., a strength) of the adjustable delay unit 410 for each communication frequency band in which the associated wireless transceiver 120 is to operate. An example approach for implementing an adjustable delay unit 410 for, e.g., coarse tuning is described below with reference to FIG. 8.

For the fine tuning phase, the feedback aspect of the delay-locked loop 130 is employed to establish and lock-in a relative phase difference between the first delayed signal 204-1 and the second delayed signal 204-2. A speed of propagation of the reference clock 202 along the first propagation path 602-1 is at least partially dependent on how quickly voltages can rise or fall between successive or consecutive delay units, or the inverters 620 of FIG. 6, as peaks and valleys of the reference clock 202 are introduced to the path. The same is true for a speed of propagation of the reference clock 202 along the second propagation path 602-2.

Due to a capacitance of each adjustable capacitor 624 that is coupled to a corresponding node between consecutive inverters 620, the speed at which voltage levels can change at the corresponding node is reduced. The higher the capacitance, the more an associated adjustable capacitor 624 retards a speed at which a voltage level can change at the corresponding node. Thus, to decrease a propagation speed of the reference clock 202, the control circuitry 306 increases a capacitance of each adjustable capacitor 624 for a given delay line. Conversely, to increase a propagation speed of the reference clock 202, the control circuitry 306 decreases a capacitance of each adjustable capacitor 624 for the given delay line.

The differential amplifier 408, each adjustable capacitor 624 of the first adjustment circuitry 604-1, and each adjustable capacitor 624 of the second adjustment circuitry 604-2 are implemented such that while the speed of propagation is increased along one propagation path 602, the speed of propagation is decreased along another propagation path 602. For example, if the difference between the phase indication 402 and the reference voltage (Vref) at the differential operational amplifier 606 is positive, the differential operational amplifier 606 generates a higher plus output voltage 404-P at the plus output 418-P and an inversely-valued, but still with a higher magnitude, minus output voltage 404-M at the minus output 418-M.

In this example, the higher plus output voltage 404-P functions as the first delay control signal 304-1 (e.g., of FIGS. 3 and 4) at the first control input 314-1 to increase the capacitance of each adjustable capacitor 624 of the first adjustment circuitry 604-1. This in turn slows the propagation of the reference clock 202 through the first propagation path 602-1 and therefore increases the first delay amount 308-1, which change is depicted in FIG. 5 at the first delay amount adjustment duration 504-1. In contrast, the lower minus output voltage 404-M functions as the second delay control signal 304-2 (e.g., of FIGS. 3 and 4) at the second control input 314-2 to decrease the capacitance of each adjustable capacitor 624 of the second adjustment circuitry 604-2. This in turn facilitates or accelerates, or at least retards to a lower degree, the propagation of the reference clock 202 through the second propagation path 602-2. The faster propagation therefore decreases the second delay amount 308-2, which change is shown in FIG. 5 at the second delay amount adjustment duration 504-2. Consequently, the total delay amount differential 502 (of FIG. 5) that is available for a differential-delay-line delay-locked loop 130 is increased and the ability of the delay-locked loop 130 to cover a wide range of frequencies is extended.

Figure 7:
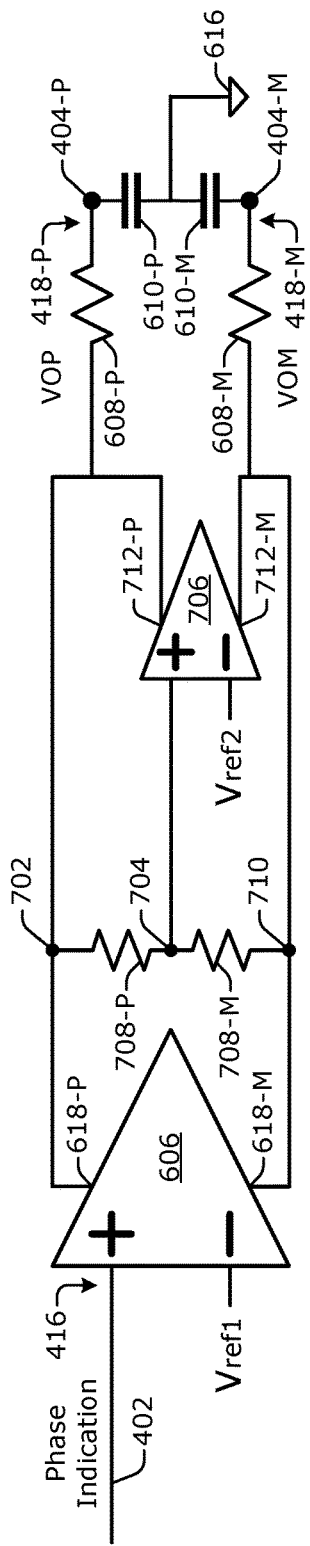
FIG. 7 illustrates an example implementation of the differential amplifier that establishes a common mode voltage using two differential operational amplifiers.

FIG. 7 illustrates an example implementation of the differential amplifier 408 that establishes a common mode voltage. With the implementation of the differential amplifier 408 that is shown in FIG. 6, the common mode voltage can float. Consequently, multiple settling points can develop with multiple potential pairs of delay amounts. To avoid this possibility, the differential amplifier 408 can be implemented using two differential operational amplifiers. For example, a common mode loop can be included at the output of the differential amplifier 408 using a differential operational amplifier 706, in addition to the differential operational amplifier 606.

As compared to the differential amplifier 408 depicted in FIG. 6, the differential amplifier 408 of FIG. 7 also includes a plus resistor 708-P, a minus resistor 708-M, and the differential operational amplifier 706. A node 702 corresponds to the plus output 618-P of the differential operational amplifier 606, and a node 710 corresponds to the minus output 618-M of the differential operational amplifier 606. Thus, the plus resistor 608-P is coupled between the node 702 and the plus output 418-P of the differential amplifier 408, and the minus resistor 608-M is coupled between the node 710 and the minus output 418-M of the differential amplifier 408.

A first reference voltage (Vref1) is coupled to the minus input (−) of the differential operational amplifier 606. The plus resistor 708-P and the minus resistor 708-M are coupled in series between the node 702 and the node 710. A node 704 is located between the plus resistor 708-P and the minus resistor 708-M. The node 704 is coupled to a plus input (+) of the differential operational amplifier 706. A second reference voltage (Vref2) is coupled to the minus input (−) of the differential operational amplifier 706. A plus output 712-P of the differential operational amplifier 706 is coupled to the node 702, and a minus output 712-M of the differential operational amplifier 706 is coupled to the node 710.

In operation, the second reference voltage (Vref2) can be tied to a middle value of an available tuning range. For instance, if a desired tuning range is 0.2 V to 0.7 V, the value of the second reference voltage (Vref2) can be set at 450 mV. This technique ensures that the first delay amount 308-1 and the second delay amount 308-2 of the first delay line 302-1 and the second delay line 302-2, respectively, has a default common mode voltage value when the plus output voltage 404-P and the minus output voltage 404-M are equal. The differential operational amplifier 706 there provides an establishment mechanism for establishing a common mode output for the differential amplifier 408. Thus, the differential feedback loop can increase or decrease the delay amounts in opposite directions based on the default value.

FIG. 8 illustrates generally at 800 an example adjustable delay unit 410. The adjustable delay unit 410 includes an adjustable inverter 802 between an input node 804 and an output node 806. The adjustable inverter 802 (e.g., an adjustable-strength inverter) can implement a variable delay. Thus, if one or more adjustable inverters are employed (e.g., along the first propagation path 602-1 of FIG. 6), coarse tuning of the delay-locked loop 130 can be accomplished using at least one adjustable inverter 802. The adjustable inverter 802 includes multiple transistors. As shown on the right of FIG. 8, the multiple transistors include five p-channel or p-type metal oxide semiconductor (PMOS) devices: P0, P1, P2, P3, and P4. The multiple transistors also include five n-channel or n-type metal oxide semiconductor (NMOS) devices: N0, N1, N2, N3, and N4.

As shown, the transistor P0 and the transistor N0 are coupled in series between a node 808 and a node 810. Together, the transistor P0 and the transistor N0 form an inverter with the input node 804 and the output node 806.

The transistors P1, P2, P3, and P4 are coupled between a source voltage (Vdd) and the node 808. Each respective transistor P1, P2, P3, and P4 has a gate that is coupled to a respective control signal CP1, CP2, CP3, and CP4. The transistors N1, N2, N3, and N4 are coupled between the node 810 and the equipotential 616. Each respective transistor N1, N2, N3, and N4 has a gate that is coupled to a respective control signal CN1, CN2, CN3, and CN4.

In operation, the speed at which the transistor P0 can be turned on or off is at least partially dependent on how many of the transistors P1, P2, P3, and P4 are turned on. The more transistors of the transistors P1, P2, P3, and P4 that are turned on, the faster the transistor P0 can be turned on, and the faster a signal propagates through the adjustable inverter 802. Similarly, the speed at which the transistor N0 can be turned on or off is at least partially dependent on how many of the transistors N1, N2, N3, and N4 are turned on. The more transistors of the transistors N1, N2, N3, and N4 that are turned on, the faster the transistor N0 can be turned on, and the faster a signal propagates through the adjustable inverter 802.

A digital register or table (not shown) can contain multiple values for the set of control signals CP1, CP2, CP3, and CP4 and the set of control signals CN1, CN2, CN3, and CN4. Each set of control signals can correspond to a communication frequency band intended for the associated wireless transceiver 120. Responsive to selection of a communication frequency band, the register or table is used to program the transistors P1, P2, P3, and P4 and the transistors N1, N2, N3, and N4 for a corresponding coarse tuning of the delay-locked loop 130.

For tuning generally, the delay-locked loop 130 can be tuned using a two-phase tuning process including a coarse-tuning phase and a fine-tuning phase. In the coarse-tuning phase, the delay-locked loop 130 is tuned by adjusting an adjustable delay unit 410 as described above with reference to FIG. 8 to reach the vicinity of the appropriate delay for a given frequency band. In the fine-tuning phase, the control circuitry 306 uses feedback to adjust at least one adjustable capacitor 624 to reach the appropriate delay for a desired phase shift. However, in alternative implementations, the components used to implement these two phases can be interchanged. In other words, the adjustable capacitor 624 can be adjusted to reach the vicinity of the appropriate delay for the given frequency band for a coarse-tuning phase. For a fine-tuning phase, at least one adjustable delay unit 410 can be adjusted to reach the appropriate delay for the desired phase shift. Thus, in such alternative implementations, the control voltage of an adjustable capacitor 624 can be used for coarse tuning, and the feedback signals from the differential operational amplifier 606 (of FIG. 6) can be routed to the gates of the transistors corresponding to the CN and CP control signals of the adjustable inverter 802 (of FIG. 8) for fine tuning.

An adjustable delay unit 410 can therefore be deployed in a delay line, such as along the first propagation path 602-1 (of FIG. 6) of the first delay line 302-1, for a coarse-tuning phase of a two-phase tuning scheme. However, other delay approaches that may use a different delay component can alternatively be implemented for a coarse-tuning phase. For example, at least one adjustable resistor (not shown) can be disposed along the first propagation path 602-1 and coupled between consecutive inverters 620, which can be non-adjustable. To control one or more adjustable resistors, a table or register, for instance, can hold a value setting a resistance of the adjustable resistor for each communication frequency band in which the associated wireless transceiver 120 is to operate. Further, as described above with regard to using an adjustable delay unit 410, adjustable resistors can alternatively be employed for a fine-tuning phase, with the adjustable capacitors used for a coarse-tuning phase.

Figure 9:
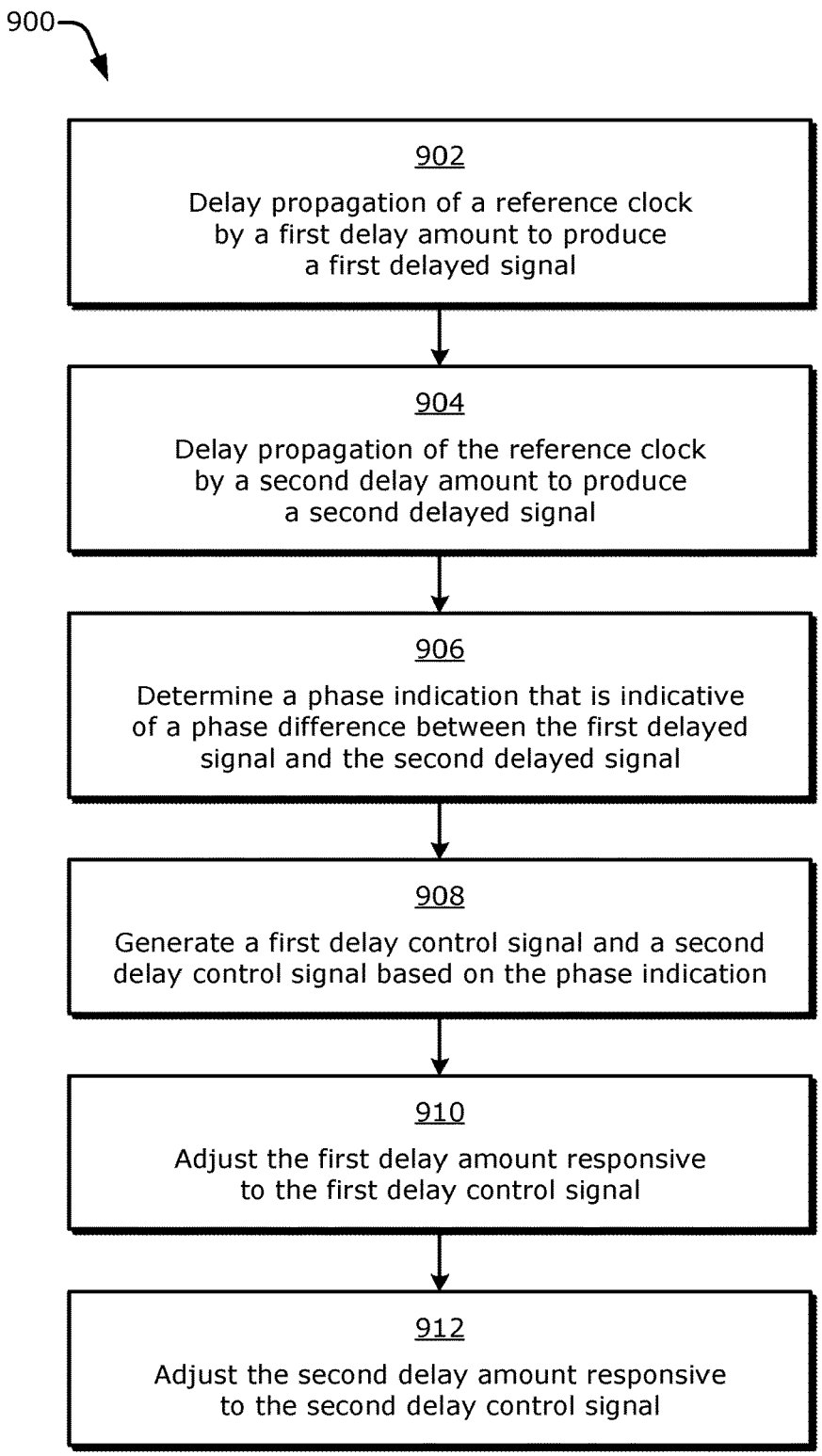
FIG. 9 is a flow diagram illustrating an example process for operating a delay-locked loop with differential delay lines.

FIG. 9 is a flow diagram illustrating an example process 900 for operating a delay-locked loop with differential delay lines. The process 900 is described in the form of a set of blocks 902-912 that specify operations that can be performed. However, operations are not necessarily limited to the order shown in FIG. 9 or described herein, for the operations may be implemented in alternative orders or in fully or partially overlapping manners. Operations represented by the illustrated blocks of the process 900 may be performed by a delay-locked loop 130 (e.g., of FIG. 1-4 or 6). More specifically, the operations of the process 900 may be performed by a first delay line 302-1, a second delay line 302-2, or control circuitry 306.

At block 902, propagation of a reference clock is delayed by a first delay amount to produce a first delayed signal. For example, a first delay line 302-1 can delay propagation of a reference clock 202 by a first delay amount 308-1 to produce a first delayed signal 204-1. For instance, a first propagation path 602-1 may cause or enable oscillations to travel through multiple delay units 410-1 to 410-$m$.

At block 904, propagation of the reference clock is delayed by a second delay amount to produce a second delayed signal. For example, a second delay line 302-2 can delay propagation of the reference clock 202 by a second delay amount 308-2 to produce a second delayed signal 204-2. For instance, a second propagation path 602-2 may cause or enable oscillations to travel through multiple delay units 410-1 to 410-$n$.

At block 906, a phase indication that is indicative of a phase difference between the first delayed signal and the second delayed signal is determined. For example, a phase detector 406 can determine a phase indication 402 that is indicative of a phase difference between the first delayed signal 204-1 and the second delayed signal 204-2. This phase detection may be performed by comparing a first phase of the first delayed signal 204-1 to a second phase of the second delayed signal 204-2.

At block 908, a first delay control signal and a second delay control signal are generated based on the phase indication. For example, a differential amplifier 408 can generate a first delay control signal 304-1 and a second delay control signal 304-2 based on the phase indication 402. To do so, a differential operational amplifier 606 may generate a plus output voltage 404-P and a minus output voltage 404-M based on the phase indication 402 and a reference voltage or another phase indication from other phase-shifted signals.

At block 910, the first delay amount is adjusted responsive to the first delay control signal. For example, control circuitry 306 can adjust the first delay amount 308-1 responsive to the first delay control signal 304-1. To do so, the control circuitry 306 may route the plus output voltage 404-P to a first control input 314-1 to change a capacitance of at least one adjustable capacitor 624 that is coupled to at least one delay unit 410 of the first propagation path 602-1.

At block 912, the second delay amount is adjusted responsive to the second delay control signal. For example, the control circuitry 306 can adjust the second delay amount 308-2 responsive to the second delay control signal 304-2. The control circuitry 306 may, for instance, adjust a capacitance of an adjustable capacitor 624 that affects how slowly or how quickly voltage levels along the second propagation path 602-2 can rise and fall.

Multiple alternatives of the process 900 or to the operations thereof may be implemented. For example, an implementation of the delaying of the propagation of the reference clock 202 by the first delay amount 308-1 to produce the first delayed signal 204-1 at block 902 can include slowing the propagation of the reference clock 202 along a first delay line 302-1 using at least one adjustable capacitor 624. Further, one delay amount may be fixed while the other delay amount is adjustable. Thus, the operation(s) of block 910 or of block 912, but not necessarily those of both, may be implemented.

Also, an example implementation of the determination at block 906 can include detecting the phase difference between a first phase of the first delayed signal 204-1 and a second phase of the second delayed signal 204-2. Further, an example implementation of the generating at block 908 can include generating, based on the phase indication 402, a plus output voltage 404-P and a minus output voltage 404-M of a differential amplifier 408 as the first delay control signal 304-1 and the second delay control signal 304-2, respectively.

The adjustment operations of blocks 910 and 912 may also be implemented in alternative manners. For example, an implementation of the adjusting of the first delay amount at block 910 can include facilitating or retarding a change in a voltage level of a first propagation path 602-1 along which the reference clock propagates to produce the first delayed signal 204-1 (e.g., by changing a capacitance of an adjustable capacitor 624 that is coupled to a node having the voltage level). Implementation of the adjusting procedure can include, at blocks 910 and 912, increasing the first delay amount 308-1 based on the first delay control signal 304-1 while decreasing the second delay amount 308-2 based on the second delay control signal 304-2.

Figure 10:
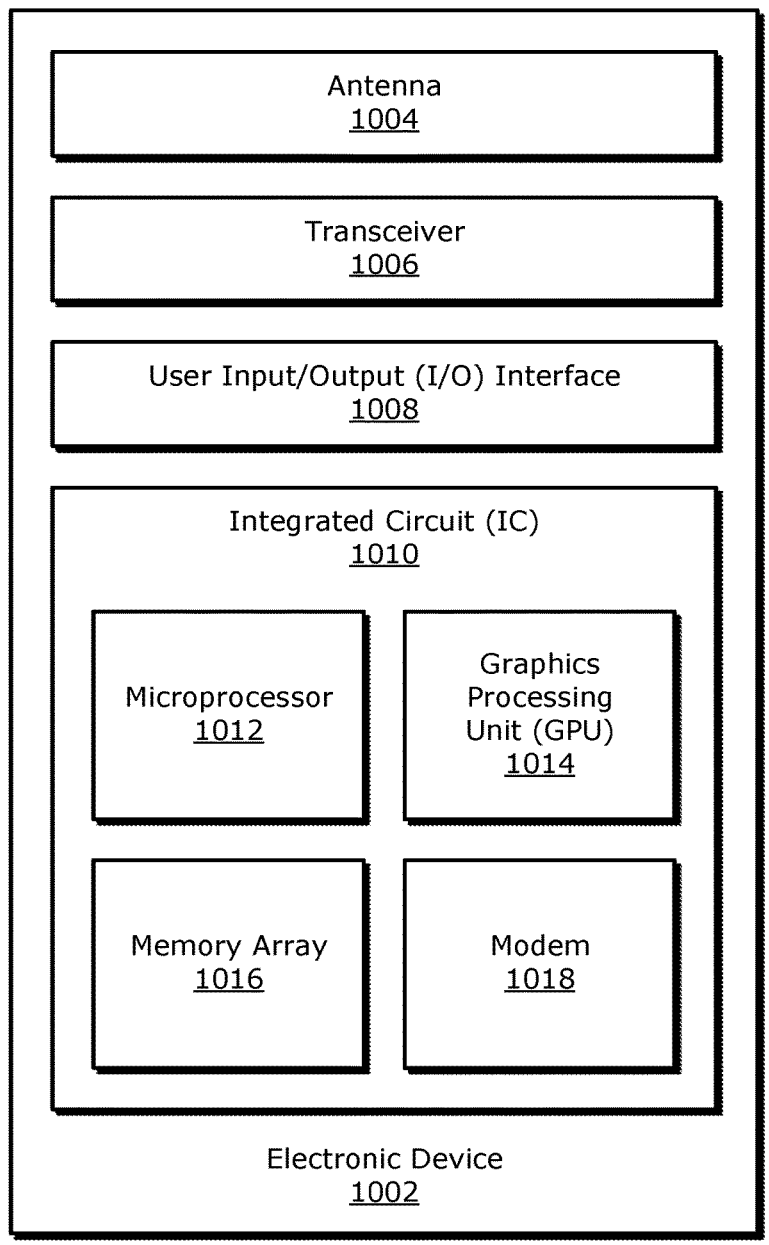
FIG. 10 illustrates an example electronic device that includes an integrated circuit in which a delay-locked loop with differential delay lines can be implemented.

FIG. 10 illustrates an example electronic device 1002 that includes an integrated circuit (IC) 1010 having multiple cores. As shown, the electronic device 1002 includes an antenna 1004, a transceiver 1006, and a user input/output (I/O) interface 1008 in addition to the integrated circuit 1010. Illustrated examples of the integrated circuit 1010, or cores thereof, include a microprocessor 1012, a graphics processing unit (GPU) 1014, a memory array 1016, and a modem 1018. In one or more example implementations, a delay-locked loop 130 with differential delay lines as described herein can be implemented by the transceiver 1006, by the integrated circuit 1010, and so forth.

The electronic device 1002 can be a mobile or battery-powered device or a fixed device that is designed to be powered by an electrical grid. Examples of the electronic device 1002 include a server computer, a network switch or router, a blade of a data center, a personal computer, a desktop computer, a notebook or laptop computer, a tablet computer, a smart phone, an entertainment appliance, or a wearable computing device such as a smartwatch, intelligent glasses, or an article of clothing. An electronic device 1002 can also be a device, or a portion thereof, having embedded electronics. Examples of the electronic device 1002 with embedded electronics include a passenger vehicle, industrial equipment, a refrigerator or other home appliance, a drone or other unmanned aerial vehicle (UAV), or a power tool.

For an electronic device with a wireless capability, the electronic device 1002 includes an antenna 1004 that is coupled to a transceiver 1006 to enable reception or transmission of one or more wireless signals. The integrated circuit 1010 may be coupled to the transceiver 1006 to enable the integrated circuit 1010 to have access to received wireless signals or to provide wireless signals for transmission via the antenna 1004. The electronic device 1002 as shown also includes at least one user I/O interface 1008. Examples of the user I/O interface 1008 include a keyboard, a mouse, a microphone, a touch-sensitive screen, a camera, an accelerometer, a haptic mechanism, a speaker, a display screen, or a projector. The transceiver 1006 can correspond to, for example, the wireless transceiver 120 (e.g., of FIGS. 1 and 2) that implements a delay-locked loop 130 having differential delay lines.

The integrated circuit 1010 may comprise, for example, one or more instances of a microprocessor 1012, a GPU 1014, a memory array 1016, a modem 1018, and so forth. The microprocessor 1012 may function as a central processing unit (CPU) or other general-purpose processor. Some microprocessors include different parts, such as multiple processing cores, that may be individually powered on or off. The GPU 1014 may be especially adapted to process visual-related data for display, such as video data images. If visual-related data is not being rendered or otherwise processed, the GPU 1014 may be fully or partially powered down. The memory array 1016 stores data for the microprocessor 1012 or the GPU 1014. Example types of memory for the memory array 1016 include random access memory (RANI), such as dynamic RANI (DRAM) or static RANI (SRAM); flash memory; and so forth. If programs are not accessing data stored in memory, the memory array 1016 may be powered down overall or block-by-block. The modem 1018 demodulates a signal to extract encoded information or modulates a signal to encode information into the signal. If there is no information to decode from an inbound communication or to encode for an outbound communication, the modem 1018 may be idled to reduce power consumption. The integrated circuit 1010 may include additional or alternative parts than those that are shown, such as an I/O interface, a sensor such as an accelerometer, a transceiver or another part of a receiver chain, a customized or hard-coded processor such as an application-specific integrated circuit (ASIC), and so forth.

The integrated circuit 1010 may also comprise a system on a chip (SOC). An SOC may integrate a sufficient number of different types of components to enable the SOC to provide computational functionality as a notebook computer, a mobile phone, or another electronic apparatus using one chip, at least primarily. Components of an SOC, or an integrated circuit 1010 generally, may be termed cores or circuit blocks. Examples of cores or circuit blocks include, in addition to those that are illustrated in FIG. 10, a voltage regulator, a main memory or cache memory block, a memory controller, a general-purpose processor, a cryptographic processor, a video or image processor, a vector processor, a radio, an interface or communications subsystem, a wireless controller, or a display controller. Any of these cores or circuit blocks, such as a central processing unit or a multimedia processor, may further include multiple internal cores or circuit blocks. A core or other aspect of the integrated circuit 1010 may implement a delay-locked loop 130 with differential delay lines to, for example, enhance a relative signal timing to facilitate acquiring valid data.

Thus, an electronic device and an integrated circuit have been described that can include a delay-locked loop with differential delay lines. In an example implementation, an integrated circuit includes a first delay line, a second delay line, and control circuitry. The first and second delay lines are coupled to a reference clock source to receive a reference clock. The first delay line produces a first delayed signal that is delayed relative to the reference clock by a first delay amount. The second delay line produces a second delayed signal that is delayed relative to the reference clock by a second delay amount. The control circuitry is coupled to the first and second delay lines. The control circuitry is configured to receive the first delayed signal, receive the second delayed signal, and adjust the first delay amount or the second delay amount based on the first delayed signal and the second delayed signal.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. A delay-locked loop (DLL) comprising:
   a first delay line including a first input and a first output, the first input coupled to a reference clock source, the first delay line configured to produce a first delayed signal;
   a second delay line including a second input and a second output, the second input coupled to the reference clock source, the second delay line configured to produce a second delayed signal; and
   control circuitry including:
      a phase detector including a first input, a second input, and an output, the first input of the phase detector coupled to the first output of the first delay line, the second input of the phase detector coupled to the second output of the second delay line, the phase detector configured to:
         receive the first delayed signal via the first input of the phase detector; and
         receive the second delayed signal via the second input of the phase detector; and
      a differential amplifier including an input, a plus output, and a minus output, the input of the differential amplifier coupled to the output of the phase detector, the plus output coupled to the first delay line, and the minus output coupled to the second delay line, the minus output being configured to adjust a delay of the second delay line.

2. The delay-locked loop (DLL) of claim 1, wherein the first delay line includes:
   a first propagation path including the first input and the first output of the first delay line; and
   first adjustment circuitry including a first control input, the first control input coupled to the plus output of the differential amplifier.

3. The delay-locked loop (DLL) of claim 2, wherein the first propagation path includes multiple delay units coupled in series between the first input and the first output of the first delay line.

4. The delay-locked loop (DLL) of claim 2, wherein the first adjustment circuitry includes at least one adjustable capacitor coupled between the first propagation path and the first control input.

5. The delay-locked loop (DLL) of claim 4, wherein the differential amplifier is configured to change a plus output voltage on the plus output to adjust a capacitance of the at least one adjustable capacitor.

6. The delay-locked loop (DLL) of claim 5, wherein:
   the phase detector is configured to determine a phase indication that is indicative of a phase difference between the first delayed signal and the second delayed signal; and
   the differential amplifier is configured to change the plus output voltage on the plus output based on the phase indication.

7. An integrated circuit comprising:
   a first delay line coupled to a reference clock source, the first delay line configured to receive a reference clock from the reference clock source and to produce a first delayed signal that is delayed relative to the reference clock by a first delay amount;
   a second delay line coupled to the reference clock source, the second delay line configured to receive the reference clock from the reference clock source and to produce a second delayed signal that is delayed relative to the reference clock by a second delay amount; and
   control circuitry coupled to the first delay line and the second delay line, the control circuitry configured to:
      receive the first delayed signal;
      receive the second delayed signal; and
      adjust the first delay amount or the second delay amount based on the first delayed signal and the second delayed signal; wherein
   the control circuitry comprises a phase detector configured to determine a phase indication based on the first delayed signal and the second delayed signal;
   the control circuitry is configured to adjust the first delay amount and the second delay amount based on the phase indication;
   the control circuitry comprises a differential amplifier coupled to the phase detector and configured to:
      receive the phase indication from the phase detector; and
      generate a first delay control signal and a second delay control signal based on the phase indication; and
   the control circuitry is configured to control the first delay amount using the first delay control signal and the second delay amount using the second delay control signal.

8. The integrated circuit of claim 7, wherein the first delay amount is different from the second delay amount.

9. The integrated circuit of claim 8, wherein the control circuitry is configured to adjust the first delay amount and the second delay amount in opposite directions.

10. The integrated circuit of claim 9, wherein the control circuitry is configured to adjust the first delay amount and the second delay amount in opposite directions by substantially equal delay amount adjustment durations.

11. The integrated circuit of claim 7, wherein the first delay line, the second delay line, and the control circuitry comprise at least a portion of a delay-locked loop (DLL) configured to establish and lock-in a relative phase difference between the first delayed signal and the second delayed signal.

12. The integrated circuit of claim 7, wherein:
the differential amplifier is configured to generate a plus output voltage as the first delay control signal and a minus output voltage as the second delay control signal; and
the control circuitry is configured to:
route the plus output voltage to the first delay line to adjust the first delay amount; and
route the minus output voltage to the second delay line to adjust the second delay amount.

13. The integrated circuit of claim 7, wherein:
the first delay line includes:
multiple nodes;
multiple delay units coupled in series between respective pairs of nodes of the multiple nodes of the first delay line; and
at least one adjustable capacitor coupled to at least a portion of the multiple nodes located between consecutive delay units of the multiple delay units of the first delay line; and
the second delay line includes:
multiple nodes;
multiple delay units coupled in series between respective pairs of nodes of the multiple nodes of the second delay line; and
at least one adjustable capacitor coupled to at least a portion of the multiple nodes located between consecutive delay units of the multiple delay units of the second delay line.

14. The integrated circuit of claim 13, wherein:
the control circuitry is configured to:
adjust the first delay amount by routing the first delay control signal to a terminal of the at least one adjustable capacitor of the first delay line;
adjust the second delay amount by routing the second delay control signal to a terminal of the at least one adjustable capacitor of the second delay line; and
change at least one of the first delay control signal or the second delay control signal until the phase difference substantially matches a desired phase difference between the first delayed signal and the second delayed signal.

15. An integrated circuit comprising:
a reference clock source configured to provide a reference clock;
a first delay line coupled to the reference clock source, the first delay line configured to produce a first delayed signal that is delayed relative to the reference clock by a first delay amount;
a second delay line coupled to the reference clock source, the second delay line configured to produce a second delayed signal that is delayed relative to the reference clock by a second delay amount; and
control means for adjusting the first delay amount or the second delay amount based on the first delayed signal and the second delayed signal, wherein:
the first delay line comprises:
propagation means for propagating the reference clock along the first delay line; and
adjustment means for adjusting a speed of propagation of the reference clock along the first delay line;
the adjustment means comprises at least one adjustable capacitor; and
the adjustment means is configured to change a capacitance of the at least one adjustable capacitor to adjust the speed of propagation of the reference clock along the first delay line responsive to the control means.

16. The integrated circuit of claim 15, wherein:
the propagation means comprises multiple delay units coupled in series; and
the propagation means is configured to route the reference clock through the multiple delay units to produce the first delayed signal.

17. The integrated circuit of claim 15, wherein the control means comprises detection means for determining a phase difference between the first delayed signal and the second delayed signal.

18. The integrated circuit of claim 17, wherein the control means comprises amplification means for generating at least one control signal based on the phase difference between the first delayed signal and the second delayed signal.

19. The integrated circuit of claim 18, wherein:
the amplification means is configured to generate a first delay control signal to adjust the first delay amount and a second delay control signal to adjust the second delay amount based on the phase difference; and
the amplification means is configured to change at least one of the first delay control signal or the second delay control signal until the phase difference substantially matches a desired phase difference between the first delayed signal and the second delayed signal.

20. The integrated circuit of claim 18, wherein the amplification means comprises establishment means for establishing a common mode output for the amplification means.

21. A method for operating a delay-locked loop (DLL), the method comprising:
delaying propagation of a reference clock by a first delay amount to produce a first delayed signal;
delaying propagation of the reference clock by a second delay amount to produce a second delayed signal;
determining a phase indication that is indicative of a phase difference between the first delayed signal and the second delayed signal;
generating a first delay control signal and a second delay control signal based on the phase indication;
adjusting the first delay amount responsive to the first delay control signal; and
adjusting the second delay amount responsive to the second delay control signal, wherein the delaying of the propagation of the reference clock by the first delay amount to produce the first delayed signal comprises slowing the propagation of the reference clock along a first delay line using at least one adjustable capacitor.

22. The method of claim 21, wherein the determining comprises detecting the phase difference between a first phase of the first delayed signal and a second phase of the second delayed signal.

23. The method of claim 21, wherein the generating comprises generating, based on the phase indication, a plus output voltage and a minus output voltage of a differential amplifier as the first delay control signal and the second delay control signal, respectively.

24. The method of claim 21, wherein the adjusting the first delay amount comprises facilitating or retarding a change in a voltage level of a first propagation path along which the reference clock propagates to produce the first delayed signal.

25. The method of claim 21, wherein the adjusting the first delay amount and the adjusting the second delay amount comprise:
increasing the first delay amount based on the first delay control signal while decreasing the second delay amount based on the second delay control signal.

* * * * *